United States Patent [19]

Nakasuji et al.

[11] Patent Number: 5,798,194
[45] Date of Patent: Aug. 25, 1998

[54] MASKS FOR CHARGED-PARTICLE BEAM MICROLITHOGRAPHY

[75] Inventors: Mamoru Nakasuji, Yokohama; Shintaro Kawata, Ibaragi-ken, both of Japan

[73] Assignee: Nikon Corporation, Tokyo, Japan

[21] Appl. No.: 858,770

[22] Filed: May 19, 1997

[30] Foreign Application Priority Data

May 22, 1996 [JP] Japan ................................. 8-127008
Aug. 23, 1996 [JP] Japan ................................. 8-222495

[51] Int. Cl.$^6$ ........................................................ G03F 9/00
[52] U.S. Cl. ........................................... 430/5; 430/296
[58] Field of Search .............................. 430/5, 311, 321, 430/296

[56] References Cited

U.S. PATENT DOCUMENTS

| | | | |
|---|---|---|---|
| 5,260,151 | 11/1993 | Berger et al. | 430/5 |
| 5,585,211 | 12/1996 | Firstein et al. | 430/296 |
| 5,624,774 | 4/1997 | Okino et al. | 430/296 |

OTHER PUBLICATIONS

Liddle et al., "Mask Fabrication for Projection Electron–Beam Lithography Incorporating the SCALPEL Technique," *J. Vac. Sci.* 9:3000–3004 (Nov. 1991).

Esashi, Masayoshi, "Micromachine," *Appl. Phys. (Japan)* 60:227–327 (Mar. 1991) (in the Japanese language with an English-language translation of the relevant portions).

*Primary Examiner*—S. Rosasco
*Attorney, Agent, or Firm*—Klarquist Sparkman Campbell Leigh & Whinston, LLP

[57] ABSTRACT

Charged-particle beam masks are disclosed that comprise a plurality of mask subfields separated by a plurality of boundary regions. The subfields are formed in a scattering layer deposited on a membrane. The membrane is supported by a support structure provided in proximity to the boundary regions. In one embodiment, the support structure comprises a plurality of support beams, parallel to each other, and preferably formed by anisotropically etching a silicon wafer. A boron-doped layer of the silicon wafer forms the membrane.

21 Claims, 6 Drawing Sheets

MASKS FOR CHARGED-PARTICLE BEAM MICROLITHOGRAPHY

FIELD OF THE INVENTION

The invention pertains to masks for charged-particle beam microlithography.

BACKGROUND OF THE INVENTION

Semiconductor integrated circuit technology has made remarkable advances in miniaturizing semiconductor device features, enabling the production of sophisticated integrated circuits. The manufacture of integrated circuits generally involves the transfer of circuit patterns onto a semiconductor wafer. Optical microlithography systems have been commonly used to project circuit patterns onto sensitized semiconductor wafers and thereby form circuit patterns on the semiconductor wafers.

As circuit geometries have become smaller, the resolution limit of optical microlithography systems due to the wavelength of light used to project circuit patterns has become a serious drawback. Microlithography systems avoiding or reducing this resolution limitation have been proposed, including systems using electron beams, ion beams, and X-rays.

Electron beam microlithography is one alternative to optical microlithography. The fabrication of masks using an electron beam to define the circuit patterns on the mask is well-known. However, a conventional electron beam exposure apparatus for mask fabrication directs an electron beam to write circuit patterns directly on the mask. While this direct-write technique produces high-resolution masks, it requires long exposure times and therefore is impractical for high-volume manufacture of integrated circuits.

Integrated circuit manufacture using a charged-particle beam requires a step-and-repeat method or a full-field exposure method. In these methods, large areas of a sensitized wafer are exposed to circuit patterns simultaneously, providing a rapid manufacturing process. The technology for producing masks for optical microlithography is well-known but charged-particle beam mask technology is still evolving.

FIGS. 6a and 6b show two conventional kinds of charged-particle beam masks. With reference to FIG. 6a, a stencil mask 21 consists of holes cut into a mask substrate 22; the holes are arranged to form patterns corresponding to circuit patterns. An aperture 23 is an exemplary hole. The mask substrate 22 is commonly made of silicon and is thick enough (about 25 μm) to absorb an incident electron beam.

The stencil mask 21 is used as follows (FIG. 6a). An electron flux EF1 irradiates the stencil mask 21. A portion EB of the electron flux EF1 is transmitted by the aperture 23. After transmission by the aperture 23, a pair of projection lenses 24a, 24b directs the transmitted portion EB to a sensitized surface of a substrate 25, e.g., a silicon wafer coated with a resist. The sensitized surface of the substrate 25 is thereby exposed to an electron flux in a shape corresponding to the aperture 23.

With reference to FIG. 6b, a scattering mask 100 contains patterns formed in a scattering layer 30 deposited on a surface of a membrane 20, generally a thin layer of silicon. The membrane 20 is thin enough to transmit an incident electron flux EF2. Circuit patterns are formed in the scattering mask 100 by creating windows in the scattering layer 20; an exemplary window 30b is shown. An electron flux EF2 incident to the scattering mask 100 is scattered by the scattering layer 30 and transmitted by the membrane 20. However, where the scattering layer 30 is provided with a window, such as the exemplary window 30b, the incident electron flux EF2 is not scattered.

Further with respect to FIG. 6b, scattering of the incident electron flux EF2 produces an image as follows. A projection lens 5 forms a crossover CO of the incident electron flux EF2. An electron beam aperture plate 7 with an aperture 7a placed in proximity to the crossover CO preferentially blocks electrons scattered by the scattering mask 100. For example, an electron flux EB2 transmitted by the exemplary window 30b in the scattering layer 30 tends to be transmitted by the aperture 7a. An electron flux EB2 scattered by the scattering layer 30 tends to be blocked by the aperture 7a. A projection lens 6 forms an image of the scattering mask 100 on a sensitized surface of a substrate 110. The contrast of this image of scattering mask 100 is proportional to the difference in electron scattering by the scattering layer 30 and the membrane 20.

The stencil mask 21 as shown in FIG. 6a has several problems. First, such a mask cannot define an annular hole because there is no support for the center. Second, because the mask substrate 22 is relatively thick, the mask substrate 22 absorbs the electron beam EF1. This absorption heats the mask and the mask thermally deforms, thereby distorting the patterns on the mask.

Improvements to the stencil mask 21 can alleviate these problems. Reducing the thickness of the mask substrate 22 reduces the absorption of the incident electron flux, reducing thermal deformation of the stencil mask 21. In addition, by putting a pattern layer on top of the mask substrate 22 and patterning the pattern layer instead of the mask substrate 22, arbitrary patterns can be formed on the mask, including doughnut-shapes.

The scattering mask 100 does not suffer from the same problems as the stencil mask 21. Because the scattering mask 100 supports the scattering layer 30 on the membrane 20, an annular window with a central hole is possible. For example, with reference to FIGS. 4a–4b, a region A of a scattering mask 201 defines a square window 230b with a central island 230a of scattering material in a scattering layer 230. In addition, because the scattering layer 230 and its supporting membrane do not absorb much of an incident electron flux, there is little heat generation and little thermal deformation.

Various materials have been used as mask substrates and membranes including $Si_3N_4$, Be, C (diamond), SiC, $Al_2O_3$, Al, Si, and $SiO_2$. Scattering layers of tungsten and gold have been studied. However, these materials have various disadvantages. Beryllium (Be) has toxic oxides. The materials $Si_3N_4$, C (diamond), SiC, $Al_2O_3$, Al, Si, and $SiO_2$ have relatively short electron mean free paths and have low electron beam transmittances.

With reference to FIG. 6b, in the scattering mask 100, high contrast projected images require that the scattering layer 30 should effectively scatter the incident electron flux EF2 and the membrane 20 should not scatter the incident electron flux EF2. Absorption of the incident electron flux EF2 by the membrane 20 should be minimized to prevent thermal deformation of the scattering mask 100.

Because the membrane 20 generally consists of an amorphous material or a metal, the membrane 20 must be extremely thin to avoid undesirable scattering. When the thickness of the membrane 20 is approximately 10 nm, it is likely that the scattering mask 100 will distort because of heat generated by electron absorption in the scattering layer 30. This distortion in the mask causes distortion in the circuit patterns as well as loss of resolution in the projected patterns.

With reference to FIGS. 4a–4b, the scattering material in the island 230a is isolated from the rest of the scattering layer 230. Therefore, heat flow from the island 230a is slow, and electron absorption by the island 230a can result in large temperature increases. In addition, if the mask membrane supporting the scattering layer 230 is made too thin, the mask membrane will be too weak to support the scattering layer 230.

Accordingly, a mask construction is needed that provides a thin, strong membrane with reduced thermal deformation. One improved mask consists of a plurality of small patterned regions on the mask, separated by unpatterned boundary regions. Such masks are stronger and less subject to thermal deformations. A lattice support can be provided at the unpatterned boundary regions.

As shown in FIG. 5, a scattering mask 201 can be divided into a two-dimensional array of patterned regions 201a separated by unpatterned boundary regions 201b. With reference to FIG. 4c, a square honeycomb-shaped support X is provided to support the scattering mask 201 at the boundary regions 201b.

With reference to FIG. 4b, a scattering mask 201 comprises a scattering layer 230 deposited on a first surface of a membrane 220. The membrane 220 transmits electrons while the scattering layer 230 scatters electrons. Windows such as exemplary window 230c are opened in the scattering layer 230 corresponding to the circuit patterns to be formed. Because the scattering mask 201 is divided into a two-dimensional array of patterned regions 201a, patterns are formed, as required, in the patterned regions 201a by opening windows in the scattering layer 230. Ribs X, supporting a second surface of the membrane 220, are provided in locations corresponding to boundary regions 201b.

The scattering mask 201 is used as follows. With reference to FIG. 4b, an electron flux 200EF is incident upon a portion of one of the patterned regions 201a. A window 230c in the scattering layer 230 transmits an electron flux 200EB2 of the electron flux 200EF. An area 230d covered by the scattering layer 230 forms a scattered electron flux 200EB1. Projection lenses 205, 206 project a demagnified pattern from the scattering mask 201 onto a sensitized substrate 310. An electron beam aperture plate 207 with an aperture 207a transmits portions of the electron fluxes 200EB1, 200EB2 that are focused near the crossover 200CO by the projection lens 205. Because the electron flux 200EB1 is more highly scattered than the electron flux 200EB2, the sensitized substrate 310 is exposed to patterns formed by the windows in the scattering layer 230.

Alternatively, a stop plate can be used instead of the aperture plate 207. A stop plate preferentially blocks unscattered electrons and the sensitized surface of the substrate 310 is exposed with image contrast reversed from that obtained with the aperture plate 207.

With reference to FIG. 5, patterns of the regions 201a of the scattering mask 201 are projected onto the sensitized substrate 310. The patterned regions 201a contain portions of the patterns to be transferred onto the sensitized substrate 310. Normally, the sensitized surface 310 is a circular wafer with a flat edge 200F. (An expanded view of a portion Va of the entire sensitized substrate 310 is shown in the lower portion of FIG. 5. After exposure, the sensitized substrate 310 comprises a two-dimensional array of fields 310a each formed by stitching together multiple transfer subfields 310b each corresponding to a respective patterned subfield or cell 201a of the scattering mask 201.

For convenience in describing the transfer of patterns from the scattering mask 201 to the sensitized substrate 310, orthogonal coordinate axes are chosen as shown in FIG. 5 such that a z-axis is parallel to an optical axis AX of an electron beam optical system, and an x-axis and a y-axis are parallel to the boundary regions 201b.

The scattering mask 201 and the sensitized substrate 310 are scanned parallel to the x-axis in directions Fm and Fw, respectively, while an electron flux EB incident to the scattering mask 201 scans parallel to the y-axis in a scan direction Am. The electron flux EB sequentially irradiates the patterned subfields 201a in a row of such subfields 201a extending parallel to the y-axis. After completing the scan of the row of the subfields 201a, an adjacent row of subfields 201a is similarly scanned by the electron flux EB. This process continues until all the subfields 201a are scanned.

The electron flux EB scans in a corresponding scan direction Aw on the sensitized substrate 310, thereby scanning sequentially across rows of transfer subfields 310b. It will be apparent that scanning directions Fm, Am of the scattering mask 201 are opposite to the corresponding scanning directions Fw, Aw on the sensitized substrate 310 because the electron optical system forms an inverted image of the scattering mask 201. Scanning speeds for the scattering mask 201 and the sensitized substrate 310 are adjusted according to the demagnification of the electron optical system. For example, if the demagnification from the scattering mask 201 to the sensitized substrate is ¼, the scanning speed of the scattering mask 201 is four times the scanning speed of the sensitized substrate 310.

Pattern transfer carried out as described above can result in gaps between the images of the mask subfields 201a on the sensitized substrate 310. The gaps correspond to the boundary regions 201b separating the subfields 201a on the mask. Therefore, the electron flux EB transmitted by the mask subfields 201a must be offset in the y-direction an amount corresponding to a y-width Ly of the boundary regions 201b. A similar offset is required in the x-direction to compensate for the x-width Lx of the boundary regions 201b.

Thus, the addition of the support X complicates the process of exposing the sensitized substrate 310 to the circuit patterns. While the support X permits a thin membrane 220 to be used in the scattering mask 201, reducing thermal and mechanical deformation, a two-dimensional correction is required in scanning. One simplification is to substitute a one-dimensional support for the two-dimensional honeycomb support X.

Another difficulty with the two-dimensional support X is that the boundary region, containing no circuit patterns, occupies a large area of the scattering mask 230. A mask provided with patterned regions such as the subfields 201a, each having a length of 1 mm, and boundary regions 201b, each having a length of 0.3 mm, a mask for ¼ demagnification made on an 8-inch wafer mask substrate cannot contain all the circuit patterns required for a 4 Gbyte DRAM chip (such a chip is approximately 18 mm by 36 mm).

Furthermore, conventional membrane materials for the mask have low electron beam transmittances and thin, uniform layers must be used to obtain a uniform transmittance. Amorphous materials (for example, $Si_3N_4$, C, $Al_2O_3$, $SiO_2$) generally have poor thermal conductivity (except for amorphous C), increasing the likelihood of thermal deformation, especially in thin layers. If a scattering layer of conventional materials such as gold or tungsten is thin enough to permit projection of high-resolution pattern, thermal deformation is likely.

SUMMARY OF THE INVENTION

The present invention provides charged-particle beam masks comprising a plurality of mask subfields formed on a membrane; the mask subfields are separated by a corresponding plurality of boundary regions that generally contain no patterns. The membrane is transmissive to an incident charged-particle flux. The charged-particle beam masks further comprise supports placed in proximity to the boundary regions.

The boundary regions and the supports extend in one direction parallel to a surface of the mask. In one embodiment, each support is formed by anisotropically etching a (110) surface of a silicon wafer. A representative height of the support is 2 mm, measured perpendicular to the surface of the membrane.

In one embodiment, a pattern layer is deposited on the membrane. The pattern layer scatters an incident charged-particle flux; patterns are formed in the pattern layer by making windows in the pattern layer. The pattern layer is made of a metallic element preferably having an atomic number of 14 to 47.

The membrane can be formed integrally with the support structure forming a boron-doped surface (B-doped) of a silicon wafer by, e.g., thermal diffusion or epitaxial growth. The support structure is readily etched into such a wafer and etching is readily stopped when the B-doped layer is reached. P-type dopants other than boron are also satisfactory.

The dimensions of the mask subfields and the supports are selected to correspond with the semiconductor device to be made. The length of the supports is typically equal to or shorter than the length of the field size of the projection lens. Some additional length is also provided to permit gaps between the supports.

Methods are provided for patterning and etching a silicon wafer to form a charged-particle beam mask with a silicon support. One surface of a silicon wafer is B-doped and a seconds surface is etched, leaving a B-doped membrane supported by a silicon support.

The foregoing and other objects, features, and advantages of the invention will become more apparent from the following detailed description of a preferred embodiment which proceeds with reference to the accompanying drawings.

BRIEF DESCRIPTION THE DRAWINGS

Figure 4A:
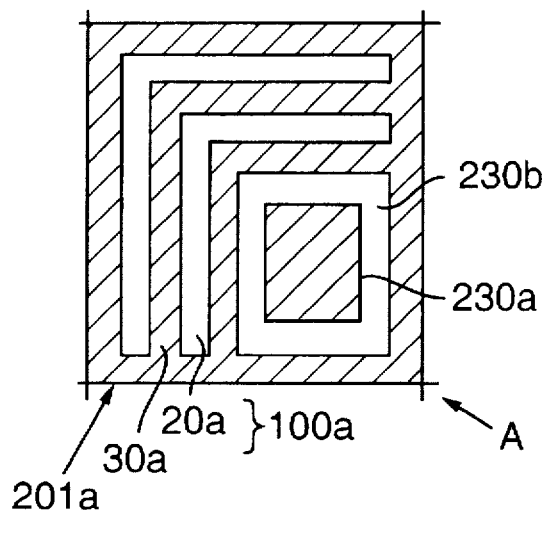
Figure 4C:
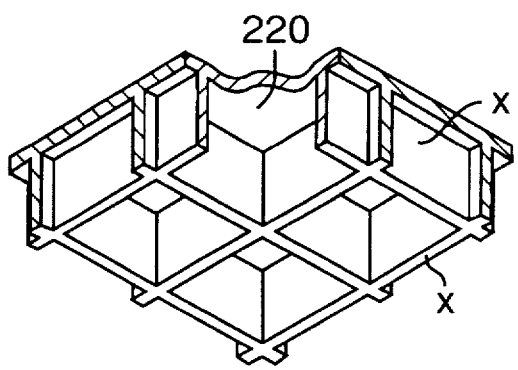
Figure 4B:
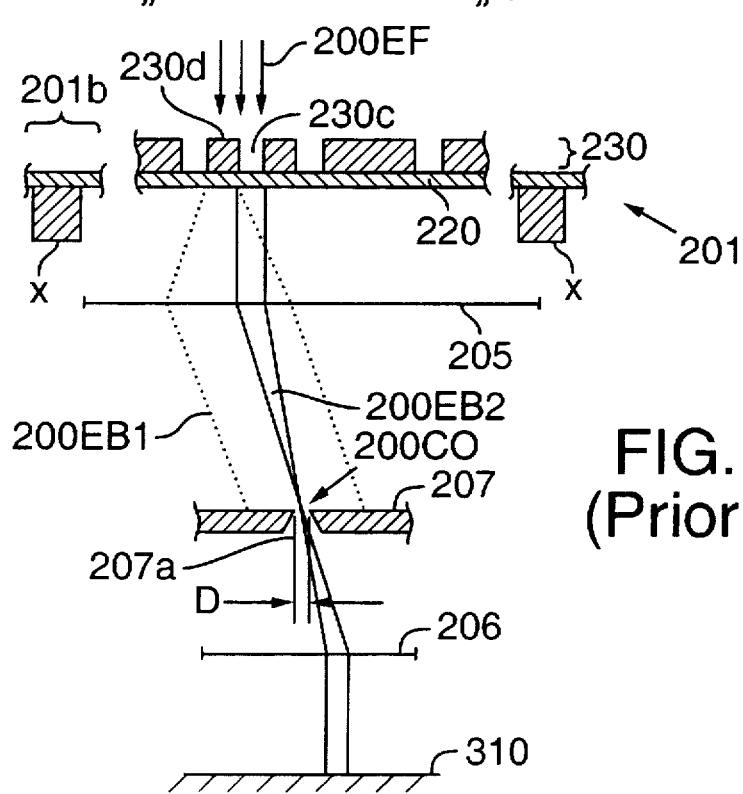

FIG. 4a is a plan view of a mask subfield of a conventional scattering mask. FIG. 4b is a partial sectional view showing projection of patterns from the conventional scattering mask to a sensitized substrate. FIG. 4c is a partial perspective view of the conventional scattering mask showing a square honeycomb-shaped support.

Figure 5:
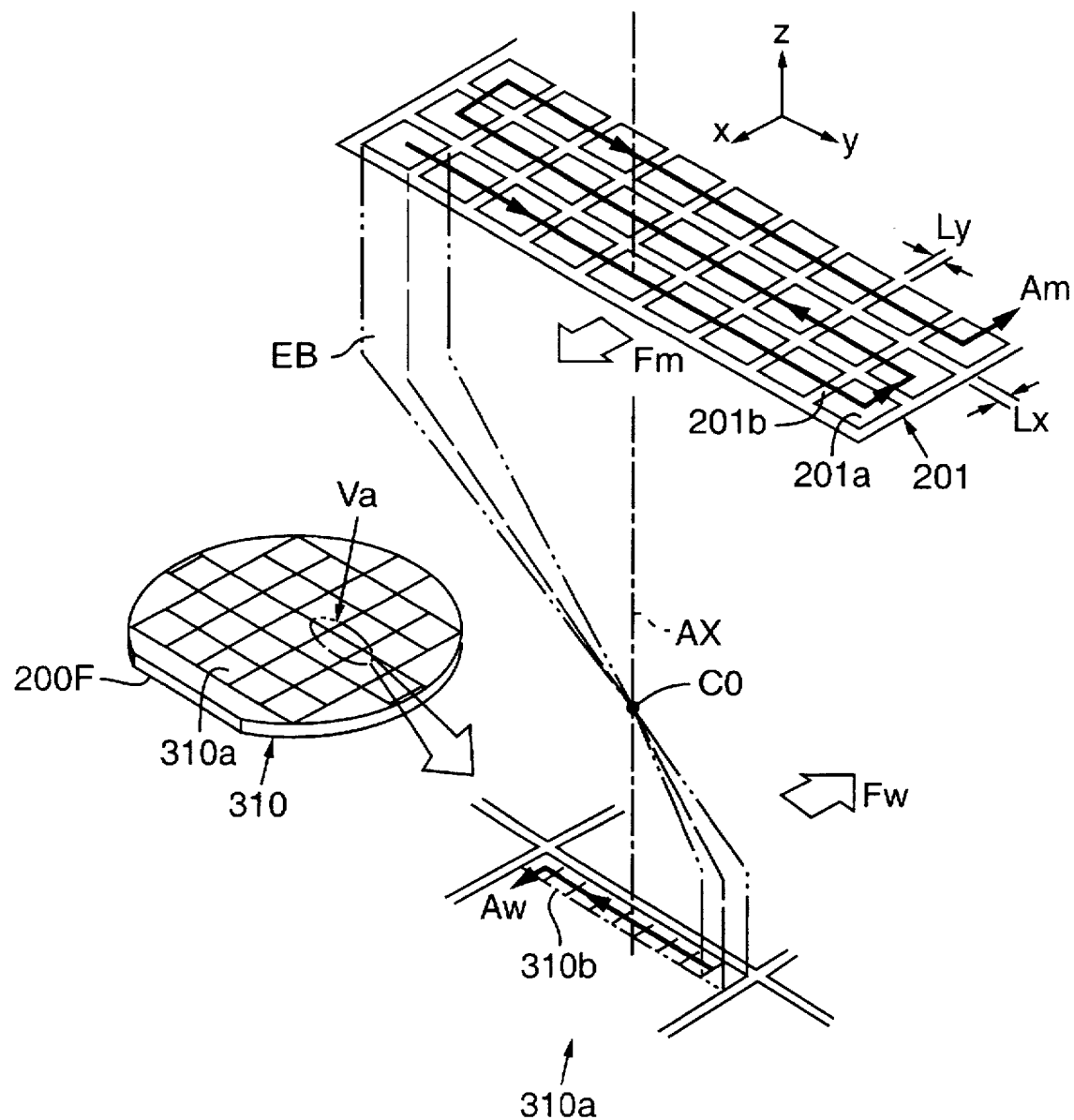

FIG. 5 is a partial perspective view showing a conventional method of exposing a sensitized substrate to patterns from a mask divided into mask subfields as shown in FIG. 4c.

Figure 6A:
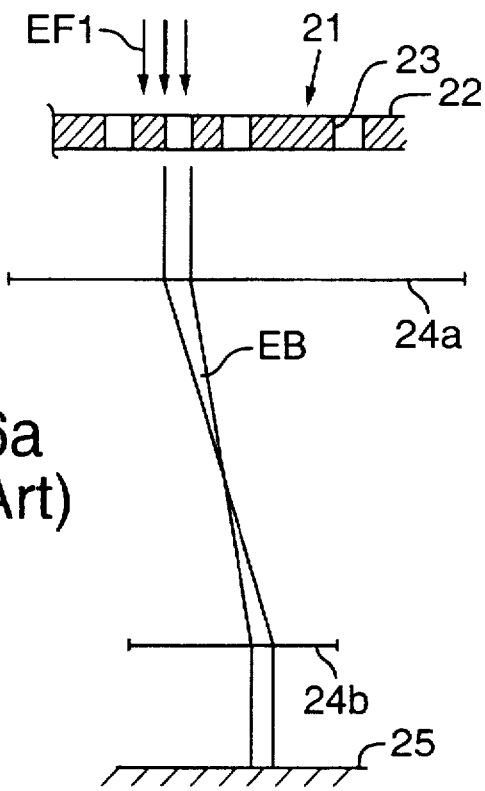
Figure 6B:
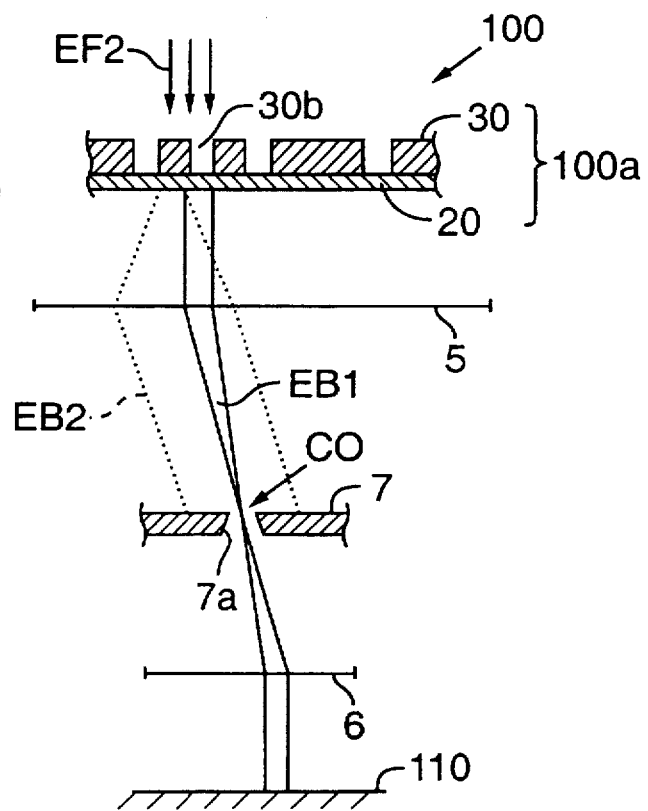

FIG. 6a is an elevational view illustrating conventional transfer of patterns from a stencil mask to a sensitized substrate. FIG. 6b is an elevational view illustrating transfer of patterns from a scattering mask to a sensitized substrate.

DETAILED DESCRIPTION

Figure 2A:
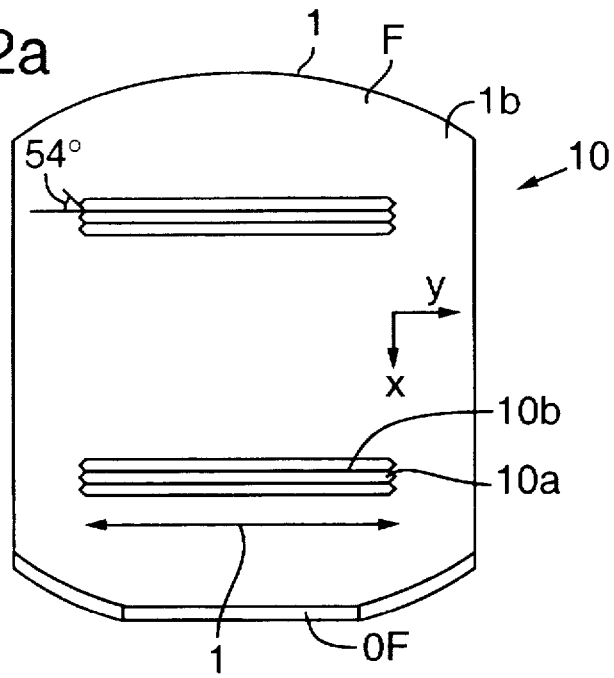
FIG. 2a is a perspective view showing a charged-particle beam mask according to Example Embodiment 1.
Figure 2B:
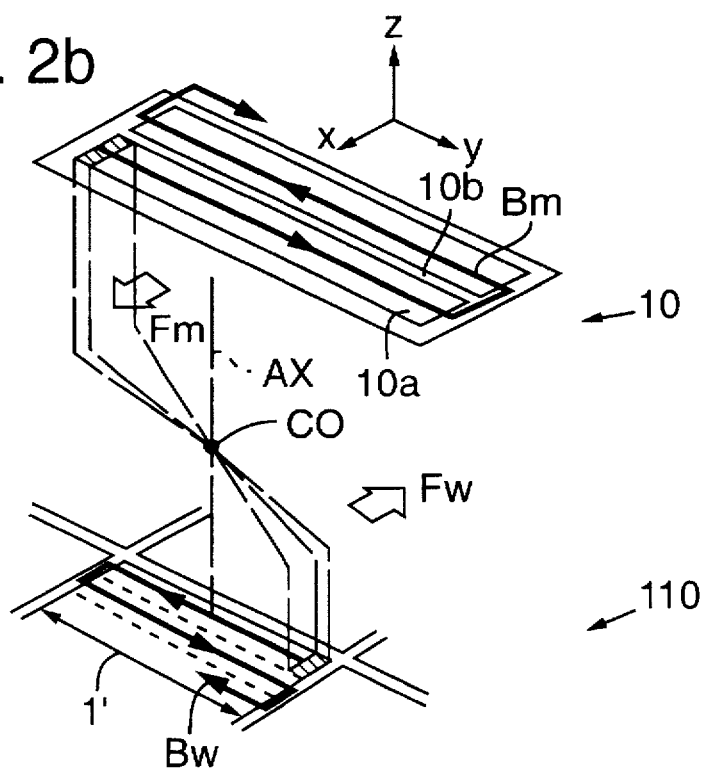
FIG. 2b is a perspective view of a method of using the charged-particle beam mask of Example Embodiment 1.

With reference to FIGS. 2a–2b, a charged-particle beam mask 10 for charged-particle beam microlithography according to Example Embodiment 1 comprises a plurality of mask subfields 10a separated from each other by a plurality of boundary regions 10b. The subfields 10a and the boundary regions 10b are elongated parallel to a y-axis that is in turn parallel to a reference flat edge OF of a silicon wafer 1. Preferably, the reference flat OF is in a (111) plane of the silicon wafer 1. The subfields 10a and the boundary regions 10b are formed in the silicon wafer 1. The silicon wafer 1 is preferably aligned so that a surface F is in a (110) plane.

Figure 1A:
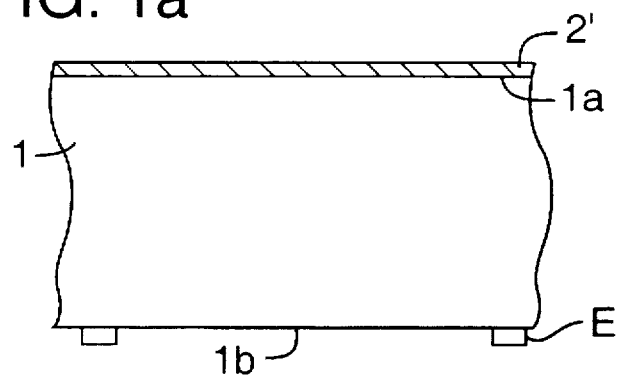
FIGS. 1a–1b are side views illustrating a portion of a manufacturing process for a charged-particle beam mask according to Example Embodiments 1–2.
Figure 1B:
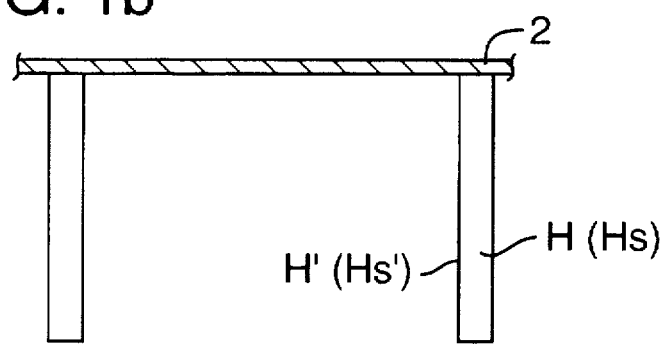
Figure 1C:
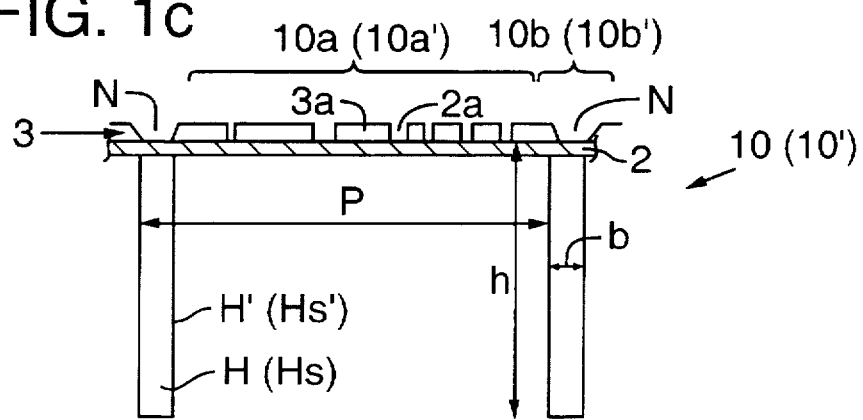
FIG. 1c is a side view of a charged-particle beam mask according to Example Embodiments 1–2.

With reference to FIG. 1c, a mask 10 according to this invention comprises a pattern layer 3 on a membrane 2. The pattern layer 3 alters an incident electron flux by scattering; providing windows such as exemplary window 2a in the pattern layer 3 permits patterns corresponding the patterning of the windows to be transferred. The pattern layer can be an electron scattering layer.

The supports H for the mask 10 is aligned with the boundary regions 10b. Because of this alignment, the support H does not interfere with scanning exposure during scanning parallel to the boundary regions 10b. The support H is single crystal silicon with a height h perpendicular to a surface of the mask 10 of 2 mm or more, sufficient to prevent deformation of the mask 10.

Any deformation of the support H can be readily calculated. The maximum deformation $\delta_{max}$ of the support H, assuming that the support H is fixed at both ends and has length L, width b, and height h, is given by the following equation:

$$\delta_{max} = 5W \cdot L^4 / 384 E \cdot I \qquad (1)$$

In Equation 1, $W=2330 \cdot 0.807$ h·b, $I=b \cdot h^3/12$, and $E=6.39 \cdot 10^{10}$ N/m² (Young's modulus of single crystal silicon). For example, if h=2 mm, $\delta_{max}=1.15 \cdot 10^{-3} \cdot L^4$ and even with L as large as L=100 mm, $\delta_{max}=0.115$ μm. If L=73 mm, a length approximately 4 times the shorter side of a 4 Gbyte DRAM chip, then the maximum deformation $\delta_{max}=0.084$ μm. If L is further reduced, $\delta_{max}$ becomes even smaller. In addition, increasing h also reduces $\delta_{max}$. If the height of the support H is greater than 2 mm, $\delta_{max}$ becomes still smaller thereby allowing the support H to hold the membrane 2 rigidly without thermal deformation.

Because the support H is perpendicular or nearly perpendicular to the membrane 2, the proportion of the mask 10 occupied by the unpatterned boundary region 10b is reduced, thereby allowing the mask 10 to hold more subfield patterns.

It will be apparent that the support H is not limited to the rectangular beam shape and that other shapes are suitable.

The mask 10 preferably comprises a scattering layer 3a of a metallic element of atomic number from 14 to 47. The thickness of the scattering layer 3a can be as little as about 200 nm for silver (atomic number 47) or as much as about 1 µm for titanium (atomic number 14). These thicknesses do not absorb enough electron flux to cause appreciable thermal deformation. In Example Embodiment 1, chromium is used.

The length L of the support H, measured parallel to the y-axis of FIG. 2b, is preferably equal to or smaller than the length of the field size of the projection lens at the mask. The support H generally is somewhat longer to account for gaps between the patterned areas. With such a mask, a 4 Gbyte DRAM chip of approximate size of 18 mm by 36 mm can be patterned with a single mask made using an 8-inch diameter silicon wafer. For example, if the field size of the projection lens at the wafer is larger than 18 mm, and if the width b of the support is 0.3 mm, then a pattern 4 times the size of a 4 Gbyte DRAM will be approximately (18·4)+1=73 mm by (36·4)(2+0.3)/2=166 mm and fit onto an 8-inch silicon wafer. An additional 1 mm is provided corresponding to the 18 mm dimension of the 4 Gbyte DRAM to provide length including lengths of end regions etched at an angle of 54° as shown in FIG. 2a. Two such lengths add an additional 1 mm. The factor (2+0.3)/2 for the other dimension provides for the width of the boundary regions 10b.

A method for manufacturing the mask can be described with reference to FIG. 1a. First, a silicon wafer 1 is prepared with the reference flat edge OF in a (111) plane of the silicon wafer 1. Second, on a first surface 1a of the silicon wafer 1, a 50 nm thick boron-doped (B-doped) silicon single crystal layer 2' is formed by epitaxial growth or thermal diffusion. Third, on a second surface 1b of the silicon wafer 1, a $Si_3N_4$ layer is deposited followed by a 1 µm thick layer of $SiO_2$. A layer of a photoresist is applied over the $SiO_2$ layer.

Fourth, the photoresist is exposed and developed to form, e.g., 72 rectangular patterns of dimensions 2 mm by 73 mm spaced every 2.3 mm; the long dimensions of the rectangular patterns are parallel to the reference flat edge OF. Fifth, the patterned resist is used as an etching mask and the $SiO_2$ layer is etched. After the $SiO_2$ is etched, etching of the $Si_3N_4$ layer begins using the etched SiO2, forming an etched $Si_3N_4$ layer E. The etched layer E is then used as an etching mask and then the membrane 2 (of B-doped silicon) and the support H (undoped silicon) are formed by anisotropically etching the (110) surface F of the silicon wafer 1 with a potassium hydroxide (KOH) solution.

Anisotropic etching of the silicon wafer 1 is done by applying a positive voltage to the (110) surface 1b of the silicon wafer 1 and applying a negative voltage to a Ti electrode while current is flowing. When the etching processes reaches a P-type layer such the B-doped layer 2', etching automatically stops because no voltage appears on the layer 2'. When etching stops, current flow in etching electrodes stops and it is apparent that etching is complete.

After these steps, formation of the support H is complete (FIG. 1b). The wall H' of the support H is a (111) silicon surface.

Next, a pattern layer 3 is formed by sputtering a 200 nm thick layer of chromium (Cr) onto the membrane 2. Chromium serves as a scattering layer is sputtered onto the membrane 2. An electron beam resist is applied over the chromium layer and a direct-write electron beam system then writes patterns in the resist.

If the pattern layer 3 completely covers the membrane 2, there can be large stresses in the membrane 2 and the membrane 2 can be damaged. Therefore, the chromium layer is sputtered without depositing chromium in areas that are not to contain circuit patterns. Regions of the membrane 2 not covered with the pattern layer 3 include areas opposite the support H and near the perimeter of the membrane 2.

The electron beam resist layer is used as an etching mask; the pattern layer 3 is patterned by reactive-ion etching (RIE) the chromium, forming a patterned chromium layer with windows 2a in the pattern layer 3. The mask 10 is then complete.

With reference to FIG. 1c, each support H has a width b of 300 µm, a length L (in the y-direction of FIG. 2a) of 73 mm, a height h (z-direction of FIG. 2b) of 2 mm. The supports H are spaced 2.3 mm apart. The wall H' of the support H is a (111) silicon surface and is perpendicular to the membrane 2.

The membrane 2 of Example Embodiment 1 has improved charged-particle beam transmittance and thermal conductivity. Satisfactory transmittance is obtained even if the thickness of the membrane 2 is as large as 50 nm. Because the membrane 2 of Example Embodiment 1 can be thicker than conventional membranes (typically only 10 nm thick), the membrane 2 is stronger and less likely to thermally deform.

In Example Embodiment 1, the pattern layer 3 is made of chromium (atomic number 24); other suitable materials are metallic elements with atomic numbers from 14 to 47. Thicknesses of the pattern layer 3 then range from 200 nm for silver (atomic number 47) to 1 µm for titanium (atomic number 14). These thicknesses are large enough to avoid thermal deformations and not so thick that high-resolution pattern transfer is impaired.

Figure 3A:
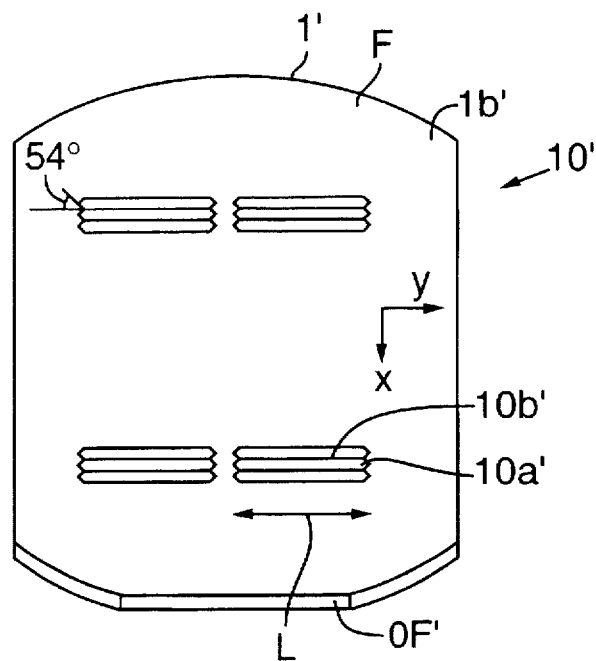
FIG. 3a is a perspective view showing a charged-particle beam mask according to Example Embodiment 2.
Figure 3B:
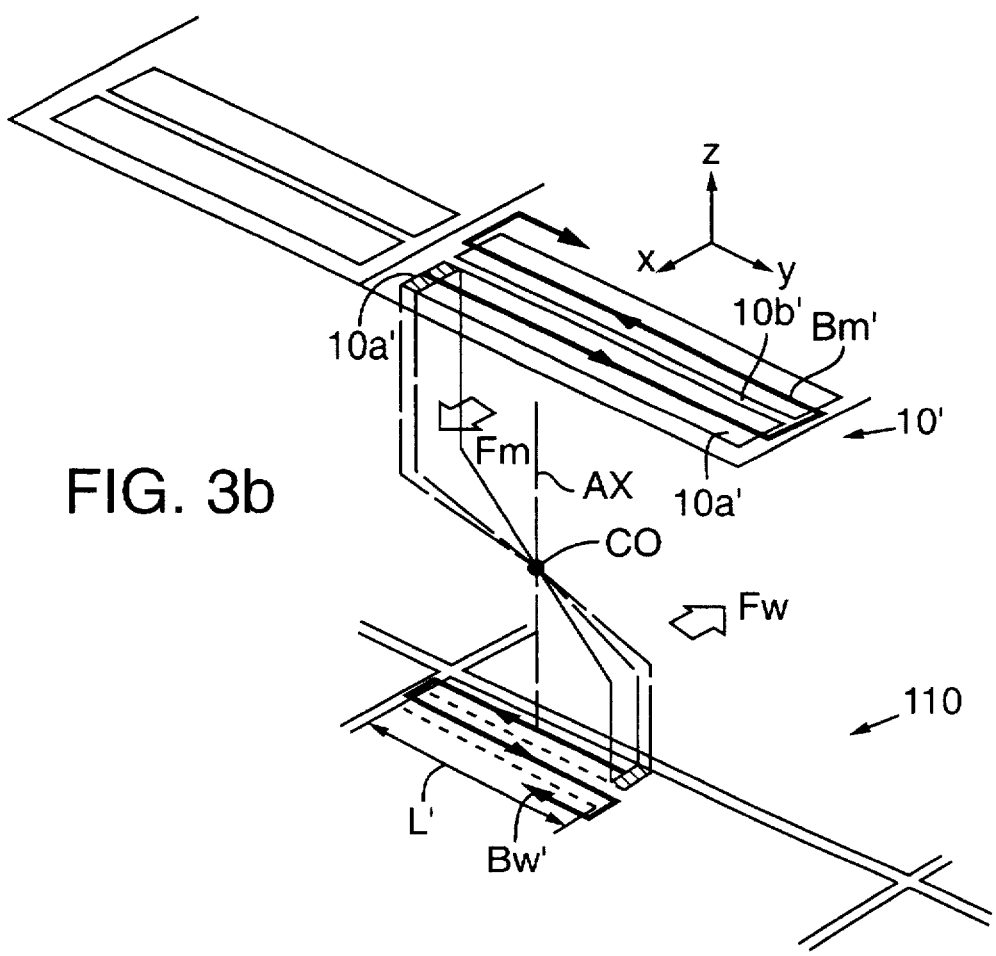
FIG. 3b is a perspective view of a method of using the charged-particle beam mask of Example Embodiment 2.

With reference to FIGS. 3a–3b, a charged-particle beam mask for charged-particle beam microlithography according to Example Embodiment 2 comprises a plurality of subfields 10a' separated by a plurality of boundary regions 10b'. The subfields 10a' and the boundary regions 10b' are elongated parallel to a y-axis that is in turn parallel to a reference flat edge OF' of a silicon wafer 1'. Preferably, the reference flat edge OF' is in a (111) plane of the silicon wafer 1'. The subfields 10a' and the boundary regions 10b' are formed in the silicon wafer 1'. The silicon wafer 1' is preferably aligned so that a surface 1b' is in a (110) plane.

The structure of the mask 10' is generally similar to the mask 10 of FIG. 2a. The dimensions of the support H differ. With reference to FIG. 1c, a mask according to Example Embodiment 2 has a support Hs with a width b of 300 µm, a length L of 11 mm, and a height h of 2 mm; the supports Hs are spaced 2.3 mm apart. The wall surface Hs' of the support Hs is (111) silicon surface and is perpendicular to the membrane 2.

Having illustrated and demonstrated the principles of the invention in multiple example embodiments, it should be apparent to those skilled in the art that the preferred embodiment can be modified in arrangement and detail without departing from such principles. For example, the Example Embodiments are described for use of an electron flux, but the invention is applicable to charged-particle fluxes generally. We claim as the invention all that comes within the scope of these claims.

What is claimed is:

1. A mask for transferring a die pattern to a sensitized substrate using a charged-particle flux and a projection lens having a field size, the mask comprising:
   (a) a membrane transmissive to the charged-particle flux, the membrane having a major surface comprising a plurality of mask subfields parallel to each other and collectively defining a mask die pattern having a width and a length parallel to the major surface, each mask subfield longitudinally extending a length that is equal to or smaller than the field size of the projection lens, each mask subfield being separated from adjacent mask subfields by a boundary region longitudinally coextensive with the mask subfield, the boundary regions being parallel to each other;

(b) a beam support separately situated beneath and attached to each boundary region and being coextensive with the respective boundary region.

2. The mask of claim 1, wherein the beam supports are made of single-crystal silicon.

3. The mask of claim 2, wherein each beam support has a height dimension perpendicular to the major surface of the membrane and walls extending in the height dimension, the walls presenting a (111) surface of crystalline silicon.

4. The mask of claim 1, wherein each beam support has a height dimension, perpendicular to the major surface of the membrane, of at least 2 mm.

5. The mask of claim 4, wherein each beam support has a height dimension perpendicular to the major surface of the membrane and walls extending in the height dimension, the walls presenting a (111) surface of crystalline silicon.

6. The mask of claim 1, further comprising a pattern layer adjacent the membrane for scattering the charged-particle flux.

7. The mask of claim 6, wherein the pattern layer comprises a metallic element of atomic number between 14 and 47 inclusively.

8. The mask of claim 7, wherein each beam support has a height dimension perpendicular to the major surface of the membrane and walls extending in the height dimension, the walls presenting a (111) surface of crystalline silicon.

9. The mask of claim 6, wherein the pattern layer defines windows corresponding to the patterns to be transferred to the sensitized substrate.

10. The mask of claim 9, wherein each beam support has a height dimension perpendicular to the major surface of the membrane and walls extending in the height dimension, the walls presenting a (111) surface of crystalline silicon.

11. The mask of claim 6, wherein the membrane is amorphous carbon.

12. The mask of claim 6, wherein the membrane is boron-doped silicon.

13. The mask of claim 12, wherein the boron-doped silicon is formed by epitaxial growth or thermal diffusion on a (110) surface of silicon.

14. The mask of claim 1, wherein the length of each beam support is no greater than the field size, at the mask, of the projection lens.

15. A method for making a mask for charged-particle-beam microlithography, the method comprising the steps:

(a) orienting a single-crystal silicon wafer with respect to its crystal axes such that a first major surface of the wafer presents a (100) surface;

(b) forming a p-type layer on the first major surface of the wafer;

(c) providing an etching mask on a second surface of the wafer, the etching mask defining supports for a mask; and (d) etching a second major surface, opposite the first major surface, of the wafer until the p-type layer is approached, thereby making supports attached to the p-type layer.

16. The method of claim 15, wherein the p-type layer is boron-doped silicon.

17. The method of claim 15, wherein step (b) comprises forming the p-type layer by epitaxial growth of p-type silicon.

18. The method of claim 15, wherein the p-type layer is formed by thermal diffusion.

19. The method of claim 16, further comprising the step of depositing a pattern layer for scattering a charged-particle flux on the P-type layer.

20. The method of claim 19, wherein the pattern layer comprises a metallic element of atomic number from 14 to 47 inclusively.

21. A charged-particle mask for transferring patterns to a sensitized substrate using a charged-particle flux and a projection lens having a field size, the mask comprising:

(a) a wafer of crystalline silicon, the wafer having first and second major surfaces both presenting a (110) surface of the crystalline silicon;

(b) a membrane comprising boron-doped silicon on the first major surface of the silicon wafer, the membrane being transmissive to the charged-particle flux and comprising a plurality of mask subfields parallel to each other and collectively defining a mask die pattern having a width and a length parallel to the first major surface, each mask subfield longitudinally extending a length no greater than the field size of the projection lens, each mask subfield being separated from adjacent mask subfields by a boundary region longitudinally coextensive with the mask subfield, the boundary regions being parallel to each other;

(c) multiple beam-shaped supports separately situated beneath and attached to the second major surface at each boundary region and being coextensive with the respective boundary region, each beam-shaped support having a height dimension perpendicular to the second major surface of at least 2 mm; and (d) a pattern layer on the first major surface and comprising a metallic element of atomic number between 14 and 47, inclusively, the pattern layer defining windows corresponding to the patterns.

\* \* \* \* \*

UNITED STATES PATENT AND TRADEMARK OFFICE
CERTIFICATE OF CORRECTION

PATENT NO. : 5,798,194

DATED : August 25, 1998

INVENTOR(S) : NAKASUJI ET AL.

It is certified that error appears in the above-indentified patent and that said Letters Patent is hereby corrected as shown below:

Column 3, line 66, insert an end parenthesis --)-- after "FIG. 5.".

Column 7, line 5, "14" should be --22--.

Column 7, line 40, "SIO$_2$" should be --SiO$_2$--.

Column 7, line 41, "SiO2" should be --SiO$_2$--.

Column 7, line 51, insert --as-- after "such" and before "the".

Column 7, line 60, insert --and-- after "layer" and before "is".

Column 8, line 28, "14" should be --22--.

Column 10, line 20, claim 19, "P-type" should be -- p-type --.

Signed and Sealed this

Sixteenth Day of November, 1999

Q. TODD DICKINSON

Attest:

*Attesting Officer*    Acting Commissioner of Patents and Trademarks